(12) United States Patent
Kurasawa et al.

(10) Patent No.: US 7,423,308 B2
(45) Date of Patent: *Sep. 9, 2008

(54) FERROELECTRIC CAPACITOR

(75) Inventors: Masaki Kurasawa, Kawasaki (JP); Kenji Maruyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/967,210

(22) Filed: Oct. 19, 2004

(65) Prior Publication Data
US 2005/0052823 A1   Mar. 10, 2005

Related U.S. Application Data

(62) Division of application No. 10/103,894, filed on Mar. 25, 2002, now Pat. No. 6,841,817.

(30) Foreign Application Priority Data
Nov. 1, 2001    (JP)    ............... 2001-336576

(51) Int. Cl.
H01L 29/76    (2006.01)
H01L 27/108    (2006.01)

(52) U.S. Cl. ............... 257/295; 257/300; 257/E27.016; 257/E27.21

(58) Field of Classification Search ......... 257/295–297, 257/300, 310, E27.017–E27.018, E27.019–E27.021; 438/3, 386, 238–239, 399, 250
See application file for complete search history.

(56) References Cited

U.S. PATENT DOCUMENTS

| | | |
|---|---|---|
| 5,387,459 A | 2/1995 | Hung |
| 5,572,052 A | 11/1996 | Kashihara et al. |
| 5,656,382 A | 8/1997 | Nashimoto |
| 5,683,614 A * | 11/1997 | Boyle ............... 252/62.9 R |
| 5,719,417 A | 2/1998 | Roeder et al. |
| 5,811,181 A * | 9/1998 | Kijima et al. ............ 428/328 |
| 5,850,089 A * | 12/1998 | Varshney et al. ......... 257/295 |
| 5,900,274 A * | 5/1999 | Chatterjee et al. ........ 427/100 |

(Continued)

FOREIGN PATENT DOCUMENTS

EP    1 150 344    10/2001

(Continued)

OTHER PUBLICATIONS

U.S. Appl. No. 10/103,894, filed Mar. 25, 2002, Masaki Kurasawa et al., Fujitsu Limited.

(Continued)

*Primary Examiner*—Howard Weiss
*Assistant Examiner*—Hoa B Trinh
(74) *Attorney, Agent, or Firm*—Staas & Halsey LLP

(57) ABSTRACT

A ferroelectric capacitor includes a lower electrode, a ferroelectric film provided over the lower electrode and having a perovskite-type structure and an upper electrode provided over the ferroelectric film. The ferroelectric film includes a first ferroelectric film part having a first crystal system and formed along at least one interface with at least one of the lower electrode and the upper electrode and a second ferroelectric film part having a second crystal system that is different from the first crystal system.

16 Claims, 15 Drawing Sheets

U.S. PATENT DOCUMENTS

| | | | |
|---|---|---|---|
| 5,998,236 A * | 12/1999 | Roeder et al. | 438/104 |
| 6,060,736 A | 5/2000 | Noshiro | |
| 6,090,443 A * | 7/2000 | Eastep | 427/255.32 |
| 6,229,166 B1 | 5/2001 | Kim et al. | |
| 6,238,966 B1 | 5/2001 | Ueda et al. | |
| 6,258,459 B1 | 7/2001 | Noguchi et al. | |
| 6,285,051 B1 | 9/2001 | Ueda et al. | |
| 6,376,090 B1 | 4/2002 | Kijima | |
| 6,385,355 B1 | 5/2002 | Nashimoto et al. | |
| 6,387,225 B1 * | 5/2002 | Shimada et al. | 204/192.18 |
| 6,411,017 B1 | 6/2002 | Qiu et al. | |
| 6,440,210 B1 * | 8/2002 | Bruchhaus et al. | 117/4 |
| 6,440,243 B1 * | 8/2002 | Tan et al. | 156/89.11 |
| 6,507,060 B2 * | 1/2003 | Ren et al. | 257/295 |
| 6,511,161 B2 | 1/2003 | Sumi et al. | |
| 6,523,943 B1 * | 2/2003 | Fukui | 347/68 |
| 6,526,833 B1 | 3/2003 | Avrahami et al. | |
| 6,541,279 B2 * | 4/2003 | Hayashi et al. | 438/3 |
| 6,541,375 B1 * | 4/2003 | Hayashi et al. | 438/679 |
| 6,576,546 B2 * | 6/2003 | Gilbert et al. | 438/629 |
| 6,602,344 B2 * | 8/2003 | Natori et al. | 117/54 |
| 6,627,930 B1 * | 9/2003 | Fox et al. | 257/295 |
| 6,748,635 B1 * | 6/2004 | Sumi et al. | 29/25.35 |
| 6,841,817 B2 * | 1/2005 | Kurasawa et al. | 257/295 |
| 2002/0015852 A1 | 2/2002 | Noguchi et al. | |
| 2002/0153543 A1 | 10/2002 | Kijima | |

FOREIGN PATENT DOCUMENTS

| | | |
|---|---|---|
| JP | 63-236797 | 10/1988 |
| JP | 04-171976 | 6/1992 |
| JP | 06-089986 | 3/1994 |
| JP | 10-214945 | 8/1998 |
| JP | 11-330411 | 11/1999 |
| JP | 2000-031399 | 1/2000 |
| JP | 2001-196652 | 7/2001 |
| WO | 00/33361 | 6/2000 |

OTHER PUBLICATIONS

Scott, J.F., et al., "Quantitative Measurement of Space-Charge Effects in Lead Zirconate-Titanate Memories", Journal of Applied Physics, vol. 70, No. 1, Jul. 1, 1991, pp. 382-388.

Kim, Min Hong, et al., "Highly (200)-Oriented Pt Films on $SiO_2$/Si Substrates by Seed Selection Through Amorphization and Controlled Grain Growth", J. Mater.Res.Soc. 14 (1999), pp. 634-637.

Office Action for Chinese Patent Application No. 02116117.5 dated Mar. 12, 2004.

Japanese Office Action dated Jan. 24, 2006 issued in corresponding Japanese Application No. 2001-336576.

European Search Report issued in European Application No. 02007739.2, dated Aug. 29, 2007 (4 pages).

Doi et al., "Influence of Buffer Layers and Excess Pb/Zr+Ti Ratios on Fatigue Characteristics of Sol-Gel Derived $Pb(Zr, Ti)O_3$ Thin Films", *Japanese Journal of Applied Physics, Japan Society of Applied Physics*, vol. 34, No. 9B, Sep. 1995.

* cited by examiner

FERROELECTRIC CAPACITOR

CROSS-REFERENCE TO RELATED APPLICATIONS

This application is related to and is a divisional and claims priority to U.S. Ser. No. 10/103,894, filed Mar. 25, 2002, entitled FERROELECTRIC CAPACITOR AND SEMICONDUCTOR DEVICE, now U.S. Pat. No. 6,841,817, which is incorporated by reference herein.

BACKGROUND OF THE INVENTION

1. Field of the Invention

The present invention relates to a semiconductor device and particularly relates to a semiconductor device having a ferroelectric capacitor.

Semiconductor memory devices such as DRAMs and SRAMs are widely used as high-speed main memory devices for information processing devices such as computers. However, such semiconductor memory devices are volatile in nature and thus information stored thereon is lost when the power supply is turned off. Non-volatile magnetic disk devices are commonly used as large-scale auxiliary storage devices for storing programs and data.

However, magnetic disk devices are bulky, vulnerable to mechanical shocks and have a large consumption power. A further drawback of magnetic devices is a slow access speed during information read/write operations. In order to obviate such drawbacks, recently, EEPROMs or flash memories that store information by accumulating electric charges on floating gate electrodes are often used as non-volatile auxiliary storage devices. Particularly, flash memories have a cell structure similar to DRAMs and can be formed at a large integration density. Therefore, flash memories are becoming of an interest as large-scale memory devices that are comparable to magnetic disk devices.

In an EEPROM or a flash memory, information is written by injecting hot electrons into floating gate electrodes via tunnel insulation film. Such memory devices have drawbacks that a writing operation is time consuming and that the tunnel insulation films deteriorate due to repeatedly performed information write/erase operations.

In order to obviate such drawbacks, a ferroelectric memory device (hereinafter referred to as FeRAM) has been proposed that stores information in the form of spontaneous polarization. Such FeRAM has a structure similar to that of the DRAM in that each memory cell transistor is provided as a single MOSFET. Further, a dielectric film in the memory cell capacitor is replaced by a ferroelectric material such as PZT (Pb(Zr,Ti)O$_3$) or PLZT ((Pb,La)(Zr,Ti)O$_3$) and further by SBT(SrBi$_2$Ta$_2$O$_9$). The FeRAM is capable of being integrated at a high integration density.

The ferroelectric semiconductor memory device controls the spontaneous polarization of the ferroelectric capacitor by applying electric fields, so that a writing speed becomes faster by a factor of 1000 or more as compared to an EEPROM or a flash-memory in which information is written by injecting hot electrons into the floating gate through the tunneling insulation film. Further, the FeRAM is advantageous in that the power consumption is reduced to about 1/10 that of an EEPROM or a flash-memory. Further, since a tunneling insulation film is not required, the FeRAM has an increased lifetime and can perform writing operations of about one hundred thousand times that of a flash-memory device.

2. Description of the Related Art

FIG. 1 shows the construction of a conventional FeRAM 10.

As shown in FIG. 1, the FeRAM 10 is constructed on a p-type Si-substrate 11 and is formed on a p-type well 11A having an active region defined by a field oxide film 12. In the active region, a gate electrode 13 is formed in correspondence to a word line of the FeRAM via a gate oxide film that is not shown in the figure. Further, n$^+$-type diffusion regions 11B and 11C are formed in the substrate 11 on both sides of the gate electrode 13 to serve as a source region and a drain region, respectively, of the memory cell transistor. A channel region is formed in the p-type well 11A at a position between the diffusion regions 11B and 11C.

The gate electrode 13 is covered by a CVD oxide film 14 that covers the surface of the Si substrate 11 in correspondence to the active regions. A ferroelectric capacitor C including a lower electrode 15, a ferroelectric film 16 such as a PZT film formed on the lower electrode 16 and an upper electrode 17 formed on the ferroelectric film 16 is formed on the CVD oxide film 14. The ferroelectric capacitor C is covered with an insulation film 18 such as a CVD oxide film. The upper electrode 17 is electrically connected to the diffusion region 11B via a local interconnection pattern 19A that contacts the upper electrode 17 at a contact hole 18A formed in the insulation film 18 and contacts the diffusion region 11B at a contact hole 18B formed in the insulation films 18 and 14.

Further, via a contact hole 18C formed in the insulation films 18 and 14, the diffusion region 11C is electrically connected to an electrode 19B that forms a bit-line of the FeRAM 10. The entire surface of the thus-formed FeRAM 10 is protected by a protection insulation film 20.

In a conventional ferroelectric capacitor, the lower electrode 15 is often made of a Ti/Pt stacked film and the ferroelectric film 16 provided on the lower electrode 15 is made of a PZT film. For such a ferroelectric capacitor, the Pt film forming the lower electrode 15 is mainly formed of Pt polycrystals oriented in the <111> direction. Therefore the orientation of the ferroelectric film 16 formed on the Ti/Pt stacked film is dominated by the orientation of the lower electrode and, as a result, is mainly oriented in the <111> direction. That is to say, it is known that such a ferroelectric capacitor has a so-called (111) orientation (see J. Appl. Phys, vol. 70, No. 1, 1991, pp. 382-388).

FIG. 2 is a schematic diagram showing a structure of a ferroelectric capacitor C of the related art.

Referring to FIG. 2, the ferroelectric capacitor insulation film 16 has a micro-structure of columnar PZT crystals extending from the lower electrode 15 to the upper electrode 17 with each columnar PZT crystals being oriented in the <111> direction. It is known that the PZT crystal belongs to a tetragonal system and has spontaneous polarization in the <001> direction. In such columnar crystals oriented in the <111> direction, the direction of polarization will be inclined against a direction of electric field connecting the upper and lower electrodes 15 and 17, as shown by arrows in FIG. 2.

FIG. 3 is a graph showing electric characteristics of such a ferroelectric capacitor. In FIG. 3, the vertical axis represents polarization and the horizontal axis represents an applied voltage. In FIG. 3, white circles indicate electric characteristics for ferroelectric capacitor of FIG. 2, when PZT crystals are oriented in the <111> direction. Black circles indicate, electric characteristics for the ferroelectric capacitor of FIG. 2, when PZT crystals are oriented in the <001> direction.

As can be seen in FIG. 3, the ferroelectric capacitor clearly presents, for either case, hysteresis properties that are specific to ferroelectric materials. As is readily understood, the ferroelectric capacitor has a greater remanent polarization and a better retention property when the PZT crystals in the capacitor insulation film 16 are oriented in a direction of applied electric field, or the <001> direction, as compared to a case where they are oriented in a direction inclined against the applied electric field, or the <111> direction.

When such a ferroelectric capacitor is used as the capacitor C for the FeRAM shown in FIG. 1, information can be retained in the form of remanent polarization of the capacitor C. The state of polarization of such a ferroelectric capacitor can be read out at the bit-line 19B via a transistor having the diffusion regions 11B, 11C and the gate electrode 13. Also, during a writing operation or an erasing operation, a predetermined writing voltage is applied to the bit-line 19B to turn on the transistor so as to apply a voltage between the electrodes 15 and 17 of the ferroelectric capacitor C, that is sufficient for reversing the polarization property of FIG. 3.

With such a ferroelectric capacitor, as shown in FIG. 4, a phenomenon called fatigue or deterioration of retention property occurs in which the value of remanent polarization Pr, that is to say, the retention property decreases with time. Also, it is known that a phenomenon called an imprint deficiency occurs when "1" or "0" is repeatedly written. Such imprint deficiency can be seen from FIG. 5, in which it is shown that the coercive voltage Vc of FIG. 3 shifts with time.

FIG. 6 is a diagram showing a retention property of a ferroelectric capacitor using a ferroelectric film of PZT polycrystals oriented in the <111> direction in comparison to a retention property of a ferroelectric capacitor using a ferroelectric film of PZT polycrystals oriented in the <001> direction.

Referring to FIG. 6, it can be seen that a fatigue clearly occurs for the ferroelectric capacitor using the ferroelectric film of PZT polycrystals oriented in the <111> direction. On the contrary, it can be seen that hardly any fatigue occurs for the ferroelectric capacitor using the ferroelectric film of PZT polycrystals oriented in the <001> direction. It may be understood that for the ferroelectric film of PZT polycrystals oriented in the <111> direction, when directions of polarization are different between a pair of neighboring domains, strain is accumulated in a domain wall, and a defect due to the strain causes deterioration of the retention property of the ferroelectric film. For the ferroelectric capacitor using the ferroelectric film of PZT polycrystals oriented in the <001> direction, directions of polarization are parallel between neighboring domains and therefore no such accumulation of strain occurs in the domain wall.

FIG. 7 is a graph showing an amount of coercive voltage shift for the same ferroelectric capacitor.

Referring to FIG. 7, it can be seen that the coercive voltage shift occurs for the case where the PZT film is oriented in the <001> direction in a similar manner to the case where the PZT film is oriented in the <111> direction. Based on a recognition that the deterioration with time of the polarization hardly occurs for the PZT film oriented in the <001> direction shown in FIG. 6, it can be assumed that any shift of the coercive voltage Vc occurring in the PZT film is not due to the strain in the domain wall shown in FIG. 2 or deterioration of the PZT film itself. Such deterioration of an imprint property can be assumed as being due to electric charges accumulated near a boundary surface between the PZT film 16 and the upper electrode 17 or the lower electrode 15 adjacent thereto.

SUMMARY OF THE INVENTION

Accordingly, it is a general object of the present invention to provide a novel and useful ferroelectric capacitor and a semiconductor device that can obviate the drawbacks described above.

It is another and more specific object of the present invention to provide a ferroelectric capacitor and a semiconductor device having improved retention and imprint properties.

In order to achieve the above objects, a ferroelectric capacitor is provided that includes:

a lower electrode;

a ferroelectric film provided over the lower electrode and having a perovskite-type structure; and an upper electrode provided over the ferroelectric film, the ferroelectric film including a first ferroelectric film part having a first crystal system and formed along at least one interface with at least one of the lower electrode and the upper electrode and a second ferroelectric film part having a second crystal system that is different from the first crystal system.

According to the present invention, a ferroelectric capacitor using a perovskite-type ferroelectric film belonging to a tetragonal system and oriented in the <001> direction is provided with a perovskite-type ferroelectric layer belonging to a rhombohedral system along at least one interface with at least one of the upper and lower electrodes. Thus, a retention property and a fatigue property of the ferroelectric capacitor is improved and the imprint deficiency can be reduced.

PZT is a material having a composition that can be generally represented as $Pb(Zr_{1-x}, Ti_x)O_3$, where x is a composition parameter and a solid-solution is formed between $PbZrO_3$ end member and $PbTiO_3$ end member. In such a system, phases belonging to some different systems appear depending on the composition of the solid-solution.

FIG. 8 is a simplified phase-equilibrium diagram of PZT. In FIG. 8, the vertical axis represents temperature and the horizontal axis represents a composition parameter x.

Referring to FIG. 8, it can be seen that with a composition x≈0.48 being taken as a boundary, a phase belonging to the tetragonal system appears on the side where Ti is rich and a phase belonging to the rhombohedral system appears on the side where Zr is rich. For a composition near the $PbZrO_3$ end member, a phase belonging to the orthorhombic system appears.

The phase belonging to the tetragonal system and the phase belonging to the rhombohedral system are both ferroelectric phases having spontaneous polarizations shown by arrows in FIG. 8. On the contrary, the $PbZrO_3$ phase belonging to the orthorhombic system does not show a ferroelectric property.

During a basic research for the present invention, the inventors have created a ferroelectric capacitor having a capacitor insulation film that is formed using not only the PZT film belonging to the tetragonal system but also a PZT film belonging to the rhombohedral system and have examined an imprint property of such a ferroelectric capacitor.

FIG. 9 is a graph similar to that of FIG. 7 and shows a result of examination of imprint property for a ferroelectric capacitor in which PZT film of various crystal phases is used as a capacitor insulation film 16. The results shown in FIG. 7 are superimposed on a graph of FIG. 9.

Referring to FIG. 9, it can be seen that in case where the PZT film belonging to the rhombohedral system oriented in the <100> direction, or, (100) oriented is used as the above-mentioned ferroelectric film 16, an amount of shift of the coercive voltage Vc becomes very small so that the amount of shift of voltage is only about −0.1 V for data retention of about 1000 hours.

It is to be noted that, for the PZT film belonging to the rhombohedral system, a value of remanent polarization is small and therefore a retention property is also lower as compared to the PZT film belonging to the tetragonal system. Accordingly, it can be understood that if such a film having a good imprint property is formed at the upper and lower electrode interfaces, respectively, it is possible to prevent deterioration of the imprint property due to charge accumulation near the electrode interface.

DETAILED DESCRIPTION OF THE PREFERRED EMBODIMENTS

In the following, principles and embodiments of the present invention will be described with reference to the accompanying drawings.

A first embodiment of the present invention will be described with reference to FIG. 10 that shows a ferroelectric capacitor 30 of a first embodiment of the present invention.

Figure 10:
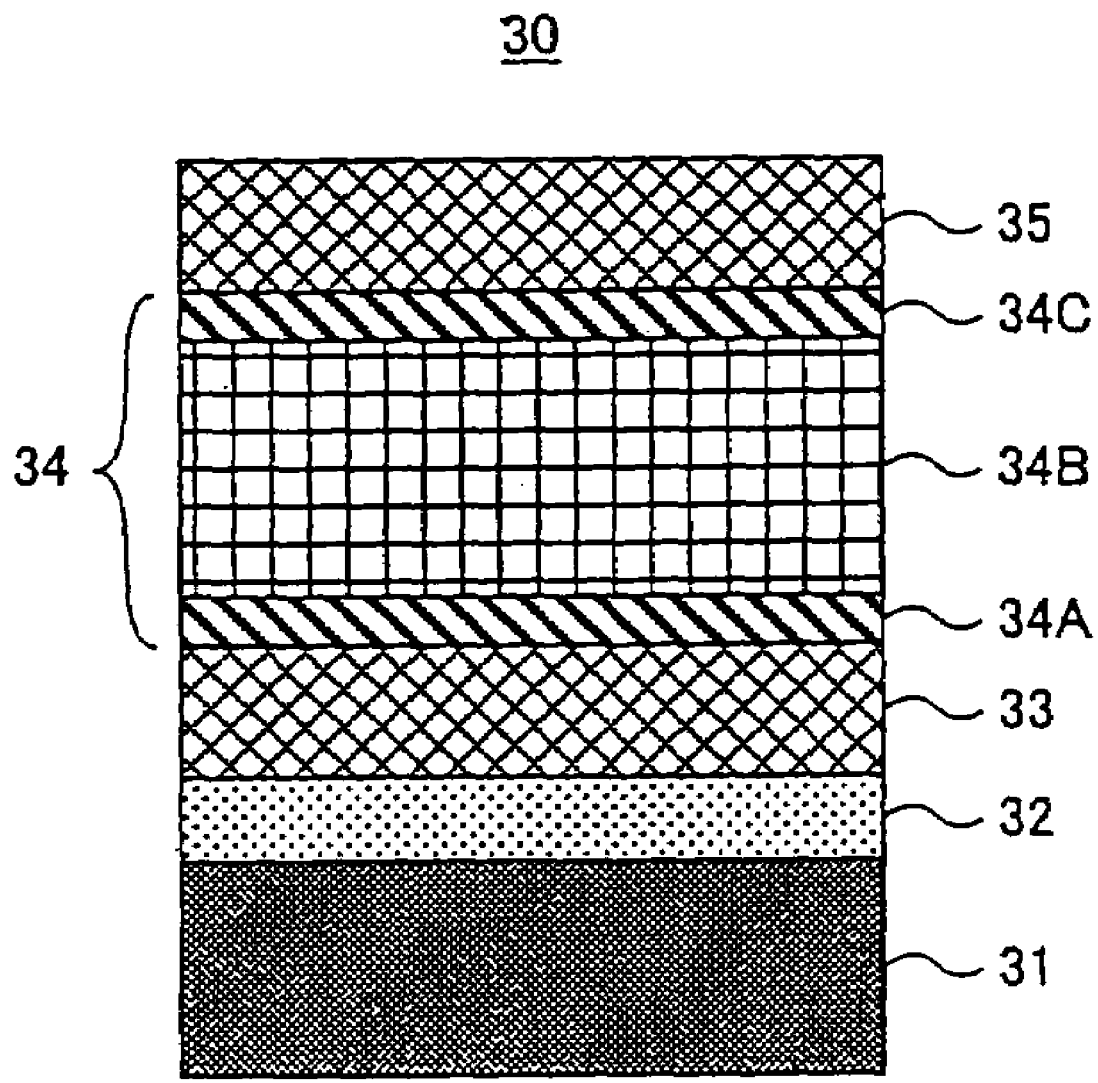
FIG. 10 is a schematic diagram showing a structure of a ferroelectric capacitor of a first embodiment of the present invention.

Referring to FIG. 10, a ferroelectric capacitor 30 is formed on a Si substrate 31 via a $SiO_2$ film 32. The ferroelectric capacitor 30 includes a lower electrode 33, a PZT film 34 formed on the lower electrode 33 and an upper electrode 35 formed on the PZT film 34. The lower film 33 is a Pt film that is mainly oriented in the <100> direction and has a thickness of typically about 100 nm.

The PZT film 34 includes a PZT film part 34A formed at an interface with the lower electrode 33, a PZT film part 34B provided on the PZT film part 34A and a PZT film part 34C provided on the PZT film part 34B at an interface with the upper electrode 35. The PZT film part 34A has a thickness of about 20 nm and is formed of PZT crystals belonging to the rhombohedral system. The PZT film part 34B has a thickness of about 180 nm and is formed of PZT crystals belonging to the tetragonal system. The PZT film part 34C has a thickness of about 20 nm and is formed of PZT crystals belonging to the rhombohedral system. The PZT film part 34A has a composition $Pb_{1.05}(Zr_{0.70}Ti_{0.30})O_3$ and is mainly oriented in the <100> direction in accordance with the direction of orientation of the lower electrode 33.

Also, the PZT film part 34B formed on the PZT film part 34A has a composition $Pb_{1.05}(Zr_{0.45}Ti_{0.55})O_3$ and is mainly oriented in the <100> direction. Further, the PZT film part 34C formed on the PZT film part 34B is mainly oriented in the <100> direction as in the case of the PZT film part 34A and has a composition $Pb_{0.05}(Zr_{0.70}Ti_{0.30})O_3$.

With the ferroelectric capacitor 30 having such a structure, a major part of the PZT film 34 is the PZT film part 34B belonging to the tetragonal system oriented in the <001> direction. Therefore, the ferroelectric capacitor 30 has a large remanent polarization and an improved retention property. Also, with such a ferroelectric capacitor, the PZT film parts 34A and 34C belonging to the rhombohedral system are provided at the interfaces with the upper and lower electrodes 33 and 35. Accordingly, it is understood that the shift of the coercive voltage caused by an accumulation of electric charges at the interfaces with the electrodes is reduced.

Figure 1:
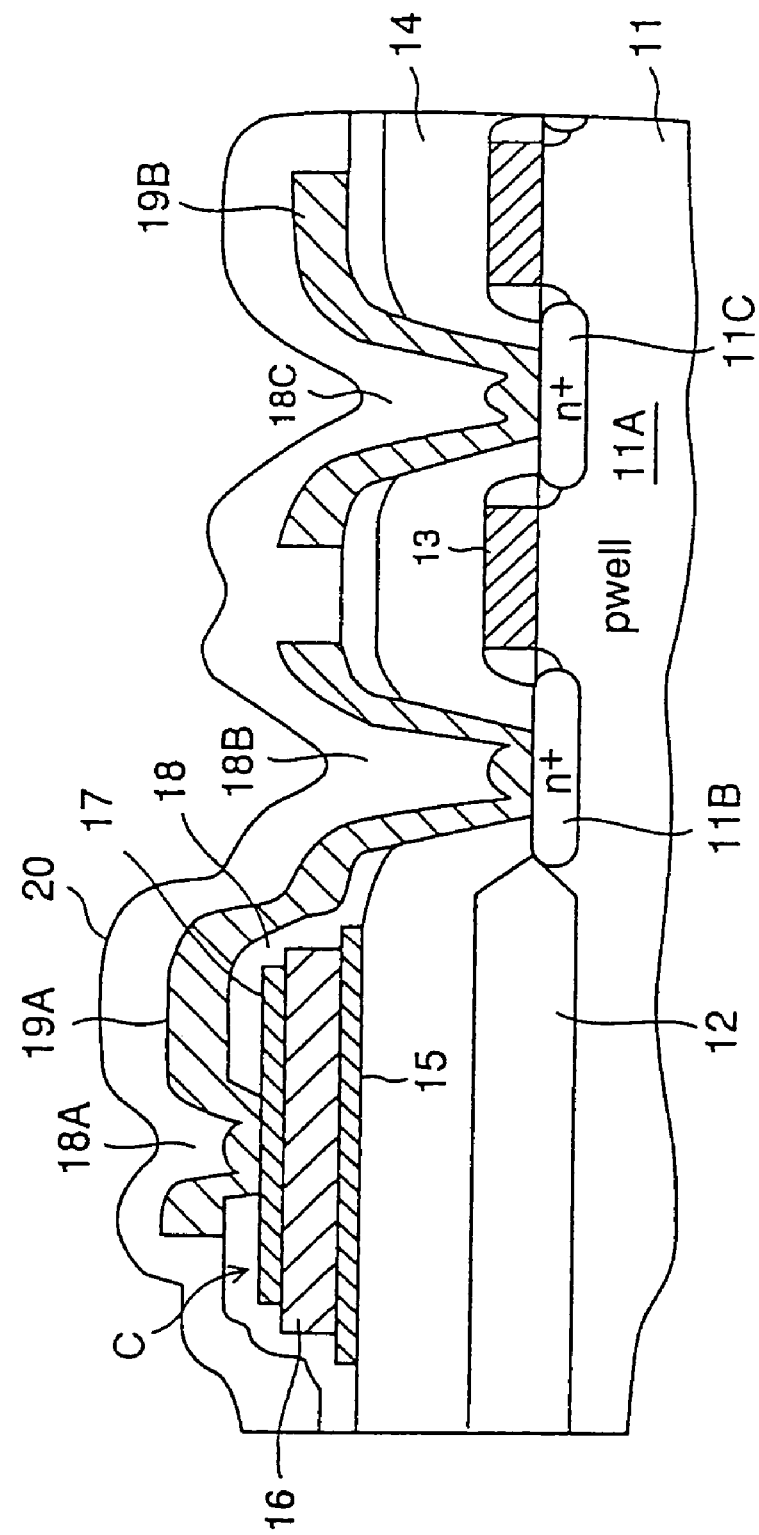
FIG. 1 is a cross-sectional diagram showing a FeRAM of the related art.
Figure 2:
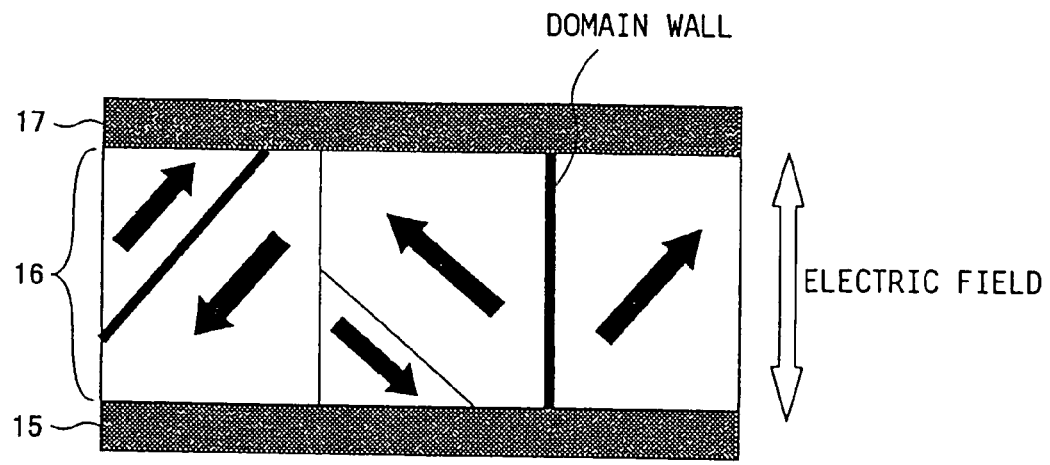
FIG. 2 is a schematic diagram showing a structure of a ferroelectric capacitor of the related art.
Figure 3:
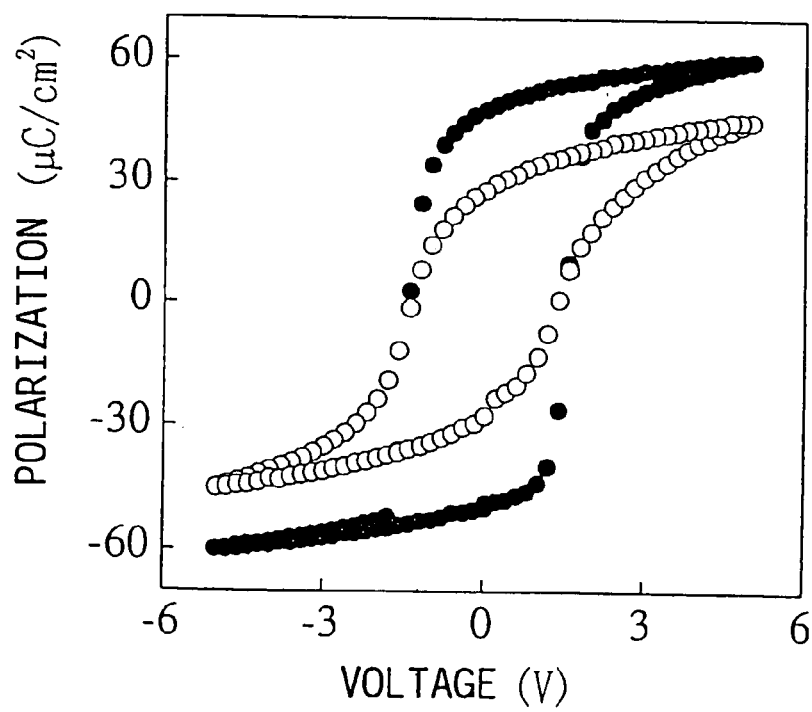
FIG. 3 is a graph showing electric characteristic of a ferroelectric capacitor of the related art.
Figure 4:
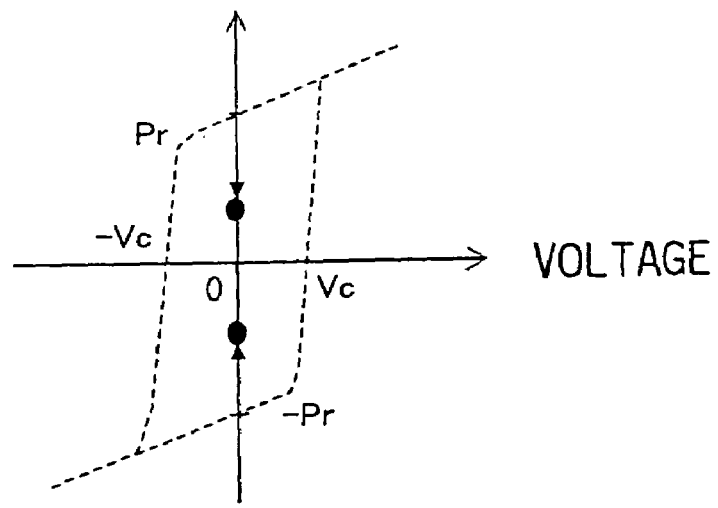
FIG. 4 is a diagram for explaining a fatigue produced in the ferroelectric capacitor.
Figure 5:
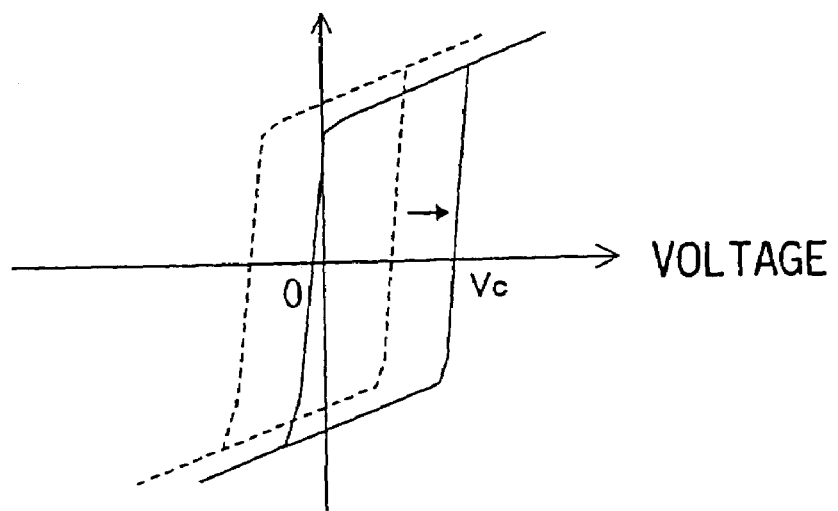
FIG. 5 is a diagram explaining an imprint deficiency produced in the ferroelectric capacitor.
Figure 6:
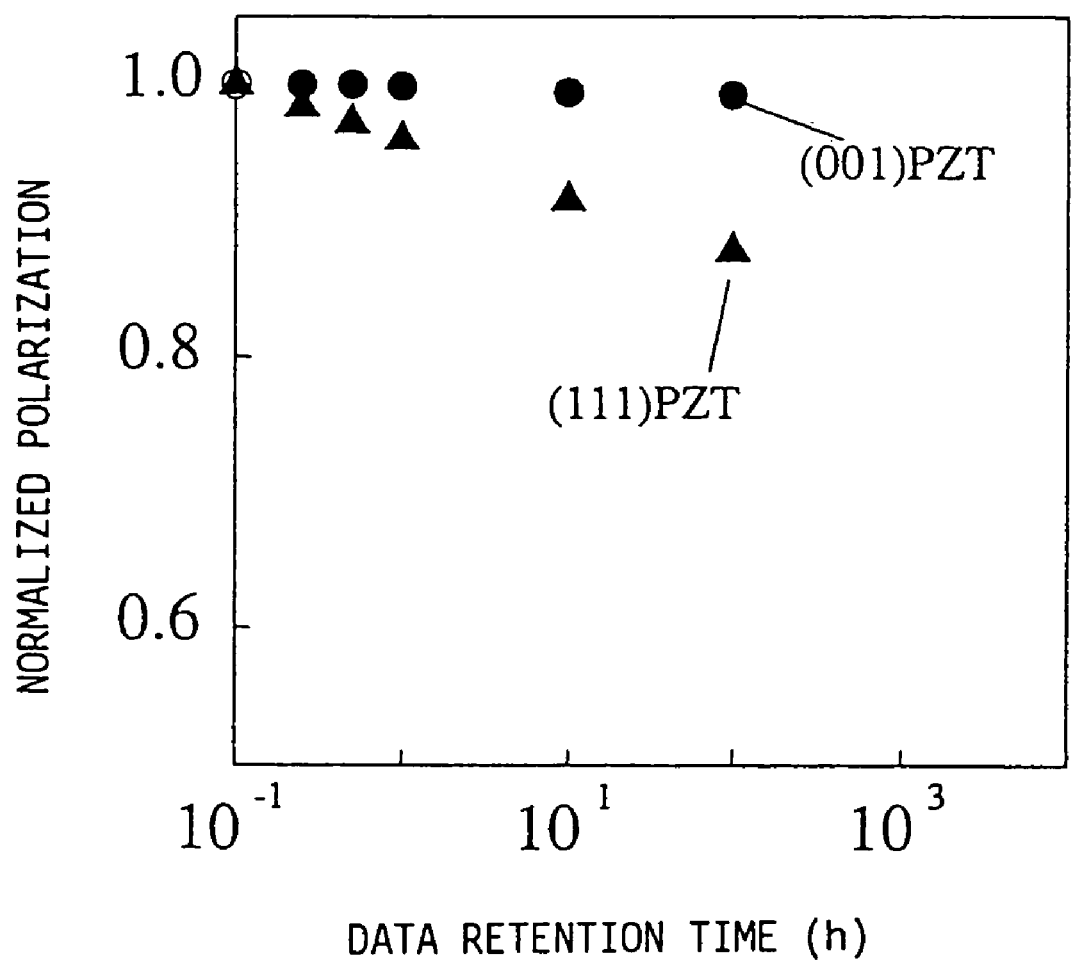
FIG. 6 is a graph showing an electric property of the ferroelectric capacitor of the related art.
Figure 7:
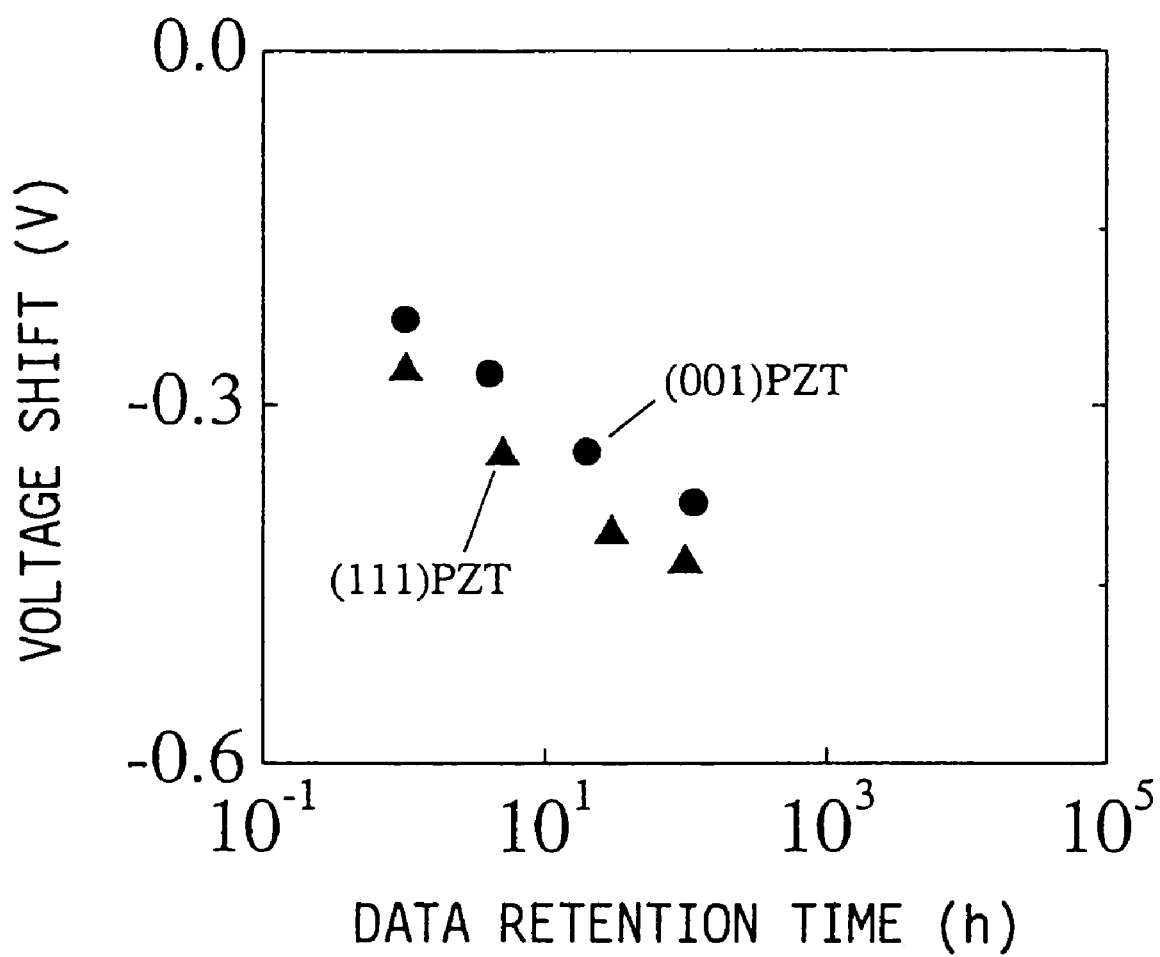
FIG. 7 is a diagram used for explaining a drawback of the ferroelectric capacitor of the related art.
Figure 8:
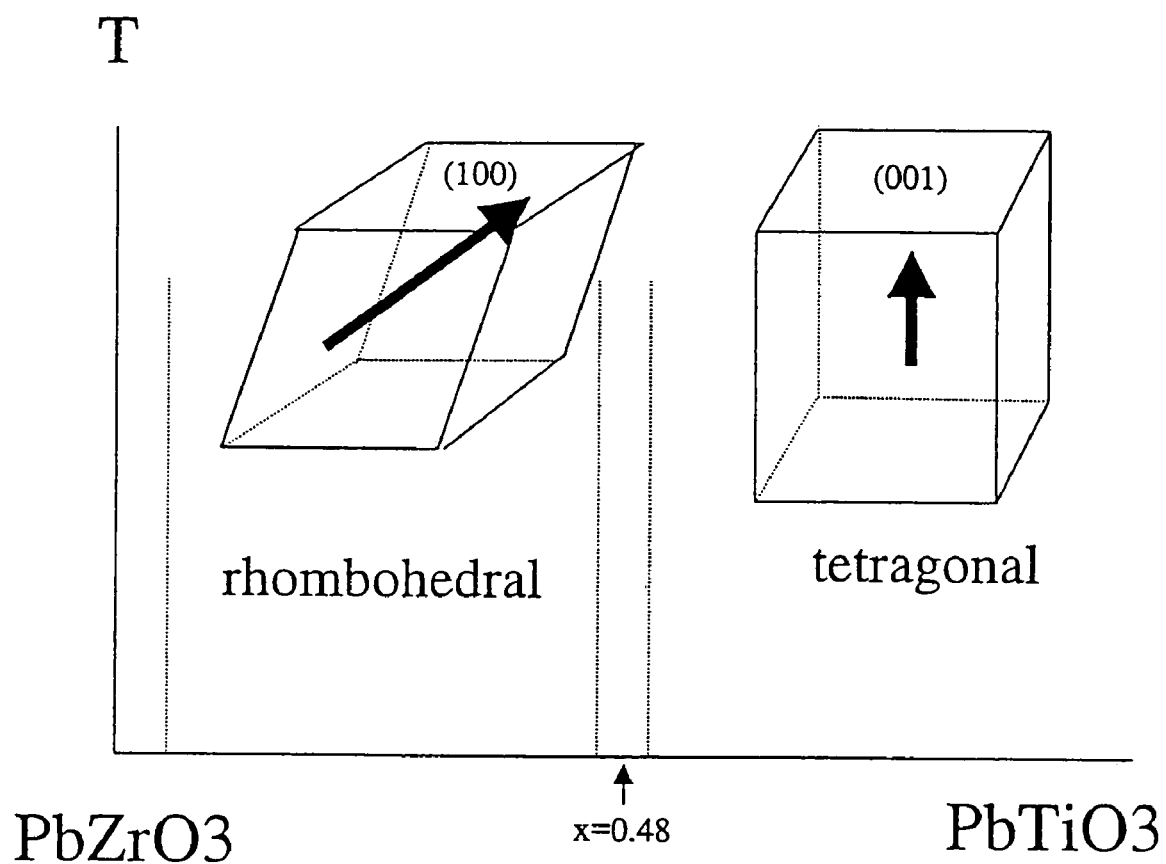
FIG. 8 is a simplified phase equilibrium diagram of the PZT system material.
Figure 9:
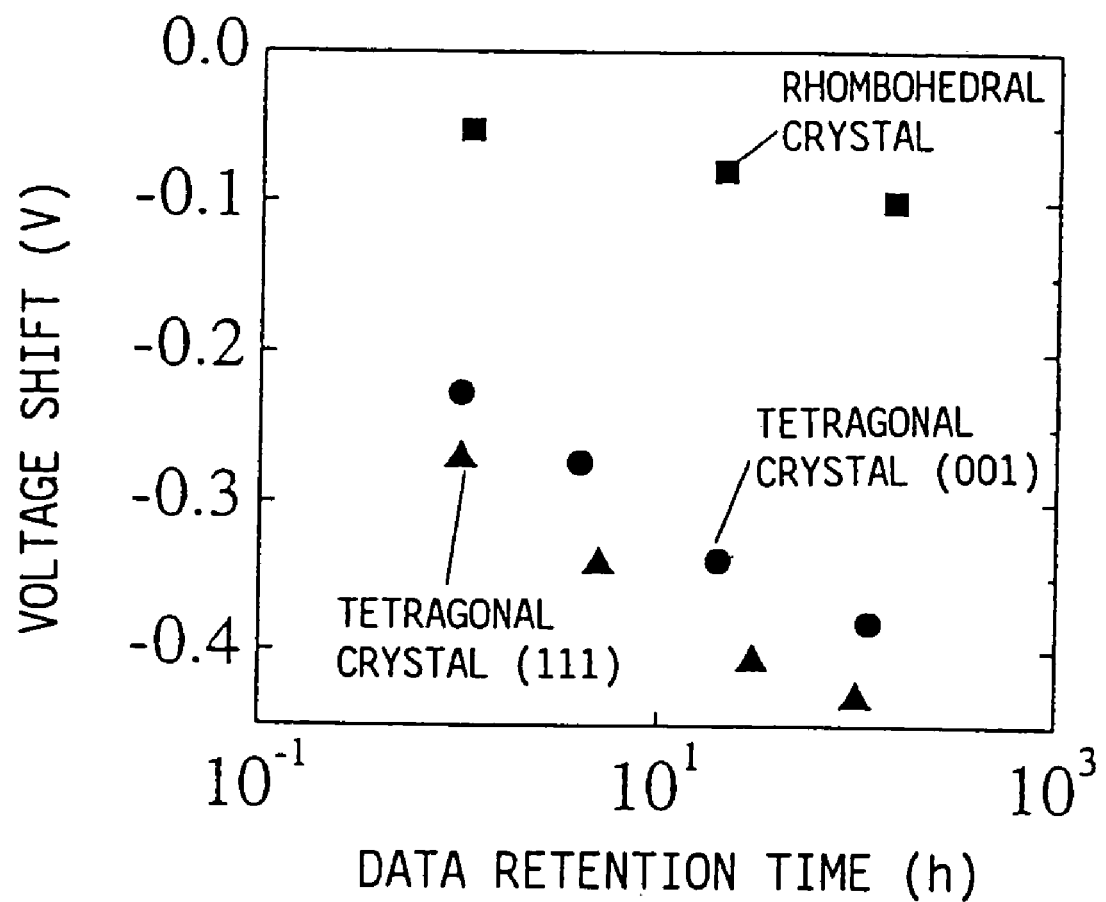
FIG. 9 is a diagram for explaining a principle of the present invention.

It is to be noted that the above-mentioned PZT film parts 34A and 34C are not limited to the phase of the rhombohedral system but may also belong to the orthorhombic system shown in the phase equilibrium diagram of FIG. 8.

Further, the PZT film parts 34A and 34C belonging to the rhombohedral system need not be formed on both interfaces with the electrodes but the same effect may be obtained with either one of the PZT film parts.

Also, any one of the PZT film parts 34A through 34C may be a PLZT film including La and its composition is expressed as $(Pb, La)(Zr, Ti)O_3$. Further, the above-mentioned PZT film parts 34A through 34C may contain Sr or Ca.

Referring to the phase equilibrium diagram shown in FIG. 8, it can be seen that the PZT film parts 34A and 34C belonging to the rhombohedral system are obtained by setting the composition parameter x in $Pb(Zr_{1-x}, Ti_x)O_3$ to a value less than about 0.48 and the PZT film part 34B can be obtained by setting the composition parameter x to a value greater than or equal to about 0.48.

Referring to FIGS. 11A through 11D, a process of fabricating the ferroelectric capacitor 30 of FIG. 10 will be described as a second embodiment of the present invention.

Figure 11C:
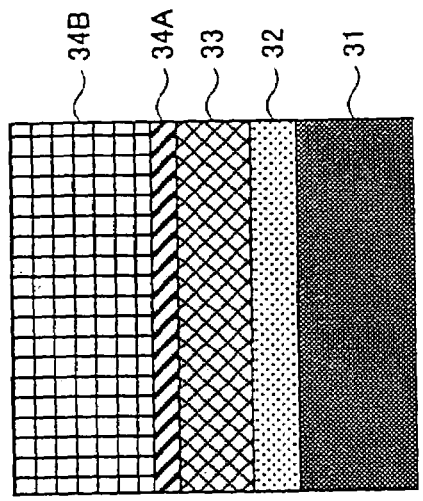
FIGS. 11A through 11D are diagrams showing various steps of a fabrication process of ferroelectric capacitors of a second and a third embodiment of the present invention.
Figure 11D:
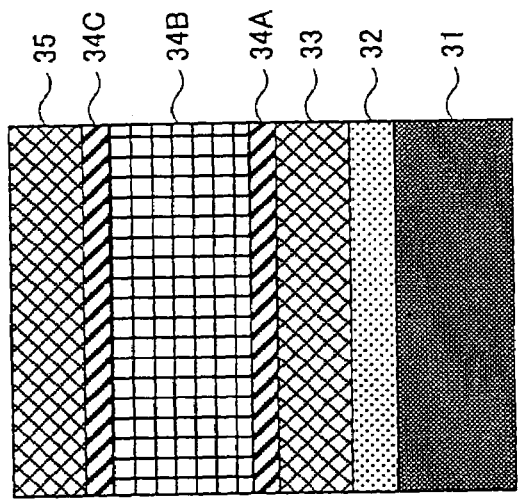
Figure 11A:
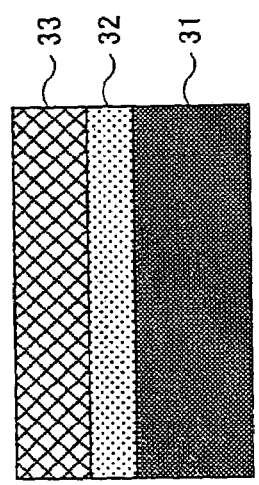

Referring to FIG. 11A, the Si substrate 31 provided with the $SiO_2$ film 32 is subjected to a sputtering process in an Ar atmosphere such that a Pt film serving as the lower electrode 33 is deposited with a thickness of about 200 nm. During the sputtering process, $O_2$ may be introduced in the sputtering atmosphere by an amount that is about 20% of the sputtering atmosphere, such that the produced Pt film is an ordinary film oriented in the normal <111> direction but may be a film oriented in the <100> direction. See, for example, M. H. Kim, et al., J. Mater. Res. Soc. Vol. 14, No. 3 (1999), pp. 634-637.

Figure 11B:
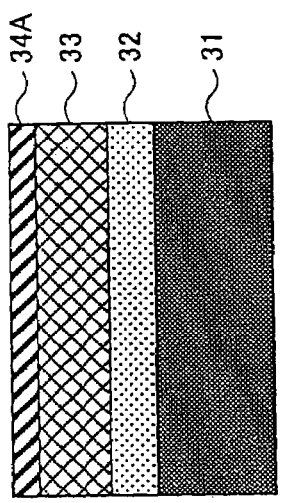

In a step shown in FIG. 11B, a sol-gel solution of 2 weight % with a Pb:Zr:Ti ratio of 105:70:30 is applied on the structure shown in FIG. 11A and dried. Then, the structure undergoes a rapid heating process for 60 seconds at 700° C. in an oxygen atmosphere. Thus, the PZT film part 34A of PZT crystals belonging to the rhombohedral system oriented in the <100> direction and having a composition expressed as $Pb_{1.05}(Zr_{0.70}Ti_{0.30})O_3$ is formed with a thickness of about 20 nm.

Then, in a step shown in FIG. 11C, a sol-gel solution of 15 weight % with a Pb:Zr:Ti ratio of 105:45:55 is applied on the structure shown in FIG. 11B and dried. Then, the structure undergoes a rapid heating process for 60 seconds at 700° C. in an oxygen atmosphere. Thus, on the PZT film part 34A, the PZT film part 34B of PZT crystals belonging to the tetragonal system oriented in the <001> direction and having a composition expressed as $Pb_{1.05}(Zr_{0.45}Ti_{0.55})O_3$ is formed with a thickness of about 180 nm.

Further, in a step shown in FIG. 11D, the PZT film part 34C of rhombohedral system is formed with a step similar to the step of fabricating the above-mentioned PZT film part 34A. Further, a Pt upper electrode 35 is formed on the PZT film part 34C by a normal sputtering process. Thus, the above-mentioned ferroelectric capacitor 30 is obtained.

For comparison, a ferroelectric capacitor having a PZT film oriented in the <111> direction as the PZT film has been formed by a similar process. It is found that for the ferroelectric capacitor 30 formed in accordance with the present embodiment, a value of the remanent polarization Pr is increased by a factor of 1.5 of the comparative ferroelectric capacitor. This may be because the PZT film 34B in the capacitor insulation film 34 is oriented in the <001> direction.

Data retaining property has been tested with an accelerated test at 150° C. for 160 hours. The result showed that for the comparative ferroelectric capacitor, the remanent polarization Pr decreased by as much as about 25%, whereas for the ferroelectric capacitor of the present invention, the decrease of the remanent polarization Pr is less than 5%.

Further, as for the shift of the coercive voltage, it has been shown that the amount of shift of the coercive voltage Vc is less than 0.1 V for the ferroelectric capacitor 30 of the present embodiment that is substantially improved as compared to the comparative ferroelectric capacitor having a 0.43 V shift of the coercive voltage.

Accordingly, with the ferroelectric capacitor 30 of the present embodiment, the electric property is improved as compared to the ferroelectric capacitor of the related art that used the PZT film oriented in the <111> direction.

It is to be noted that in the present embodiment, the PZT film is formed on the Pt electrode oriented in the <100> direction, but the PZT film may also be formed on an ordinary Pt electrode having an (111) orientation that is oriented in the <111> direction.

In the present embodiment, the PZT film may be formed by a sputtering process.

In such a case, an amorphous PZT film with a Ti composition x being less than 0.48 (x<0.48) is crystallized by a rapid heating process in an oxygen atmosphere to form the PZT film 34A belonging to the rhombohedral system. Then, an amorphous PZT film of a Ti composition x being greater than or equal to 0.48 (0.48≦x) is formed by a sputtering process. The amorphous PZT film is crystallized in an oxygen atmosphere to form a PZT film 34A belonging to the tetragonal system. In a manner similar to the above-mentioned PZT film 34A, the PZT film 34C belonging to the rhombohedral system is formed by sputtering and rapid heating processes.

It is to be noted that the above-described PZT films 34A, 34B and 34C may be formed by a CVD method.

Referring again to FIGS. 11A through 11D, a method of fabricating a ferroelectric capacitor of a third embodiment of the present invention will be described, wherein the PZT films 34A, 34B and 34C are formed by a CVD process.

In the present embodiment, the step of FIG. 11A is the same as the previous embodiment. A Pt film oriented in the <100> direction is formed as the lower electrode 33 on the $SiO_2$ film 32 covering the Si substrate 31.

Then, in the step shown in FIG. 11B, a sample of the structure shown in FIG. 11A is introduced into a processing container of a CVD apparatus (not shown). An internal pressure of the processing container is set to a range between 130 and 1300 Pa and the temperature of the substrate under process is set to a range between 500 to 600° C.

Under such a condition, $Pb(DPM)_2$, $Zr(DMHD)_4$ and $Ti(iPrO)_2(DPM)_2$ diluted with THF are introduced into the processing container as Pb, Zr and Ti vapor phase materials with a flow ratio of 1:0.56:0.46. A carrier gas containing for example Ar or He and an oxidation gas such as $O_2$ gas are also introduced into the processing container. Thus, the PZT film part 34A of the rhombohedral system is grown on the Pt film 33 with a thickness of about 20 nm.

Then, in the step shown in FIG. 11C, the flow ratio of the above-mentioned vapor phase material is altered to 1:0.55:0.55. Thus, the PZT film part 34B of the tetragonal system is grown on the PZT film part 34A with a thickness of about 180 nm.

Finally, in the step shown in FIG. 11D, the flow ratio of the above-mentioned vapor phase material is set to a value equal to the case of FIG. 11B, so as to grow the PZT film part 34C on the PZT film part 34B.

It is to be noted that in addition to $Pb(DPM)_2(Pb(C_{11}H_{19}O_2)_2)$ described above, $Pb(C_5H_7O_2)_2$ and $Pb(C_{11}H_{19}O_2)2(C_{10}H_{22}O_5)$ can be used as the vapor phase material of Pb. Similarly, in addition to $Zr(DMHD)_4$ described above, $Zr(DPM)_4$ and $Zr(tBuO)(DPM)_3$ can be used as the vapor phase material of Zr. Further, in addition to $Ti(iPrO)_2(DPM)_2$ described above, $Ti(i-PrO)_2(DMHD)_2$ and $Ti(t-AmylO)_2(DMHD)_2$ can be used as the vapor phase material of Ti.

Referring to FIGS. 12A through 17R, a process of fabricating an FeRAM according to the fourth embodiment of the present invention will be described.

Figure 12A:
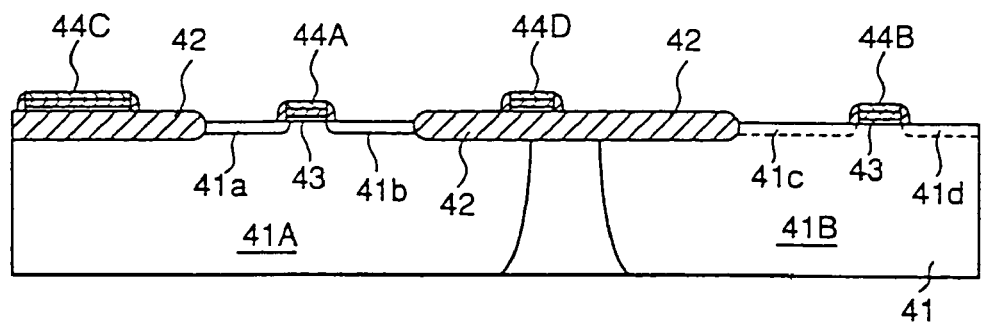
FIGS. 12A through 12C are diagrams showing various steps of fabricating FeRAM according to the fourth embodiment of the present invention.

Referring to FIG. 12A, a p-type well 41A and an n-type well 41B are formed on a p-type or an n-type Si substrate 41. Further, field oxide films 42 defining respective active regions are provided on the Si substrate 41 in the wells 41A and 41B.

Gate oxide films 43 are formed on the active regions of the p-type well 41A and the n-type well 41B. For the p-type well 41A, a p-type polysilicon gate electrode 44A is formed on the gate oxide film 32 and for the n-type well 41B, an n-type polysilicon gate electrode 44B is formed on the gate oxide film 43. Also, in an example shown in the figure, polysilicon interconnection patterns 44C and 44D extend on the field oxide films 42 in a manner similar to the polysilicon gate electrodes 44A and 44B.

Also in a structure shown in FIG. 12A, n-type impurities are ion implanted into the active region of the p-type well 41A using the gate electrode 44A and side wall insulation films on both sides of the gate electrode 44A as a self-aligning mask so as to form n-type diffusion regions 41a and 41b. Similarly, p-type impurities are ion implanted into the active region of the n-type well 41B using the gate electrode 44B and side wall insulation films on both sides of the gate electrode 44B as a self-aligning mask so as to form p-type diffusion regions 41c and 41d.

The process so far is nothing but an ordinary CMOS process.

Figure 12B:
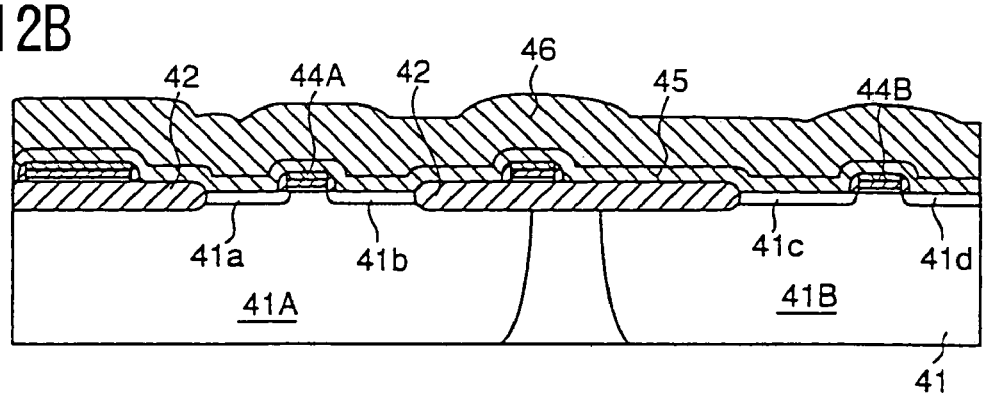

Next, in a step shown in FIG. 12B, an SiON film 45 having a thickness of about 200 nm is deposited by performing a CVD process on the structure shown in FIG. 12B. Further, an $SiO_2$ film 46 having a thickness of about 1000 nm is deposited thereon.

Figure 12C:
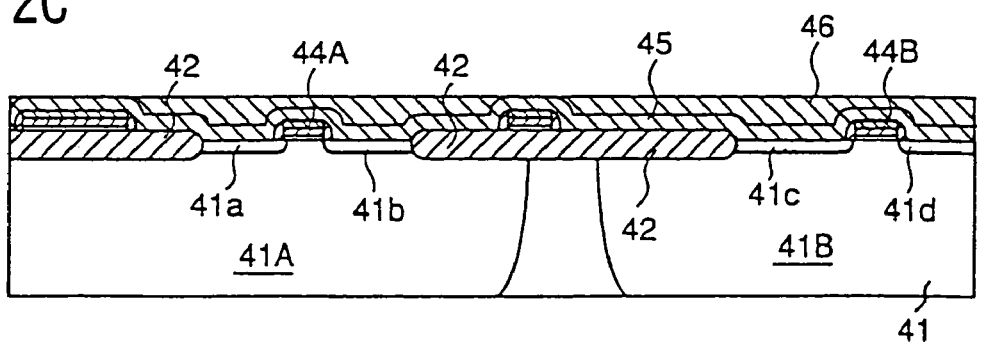

In a step shown in FIG. 12C, the $SiO_2$ film 46 is polished and planarized by a CMP (chemical mechanical polishing) process with the SiON film 45 being used as a stopper. In a step shown in FIG. 13D, contact holes 46A to 46D are formed through the planarized $SiO_2$ film 36 such that the diffusion regions 41a, 41b, 41c and 41d are exposed, respectively. In an example shown in the figures, the $SiO_2$ film 46 is further provided with a contact hole 46E that exposes the connection pattern 44C.

Figure 13D:
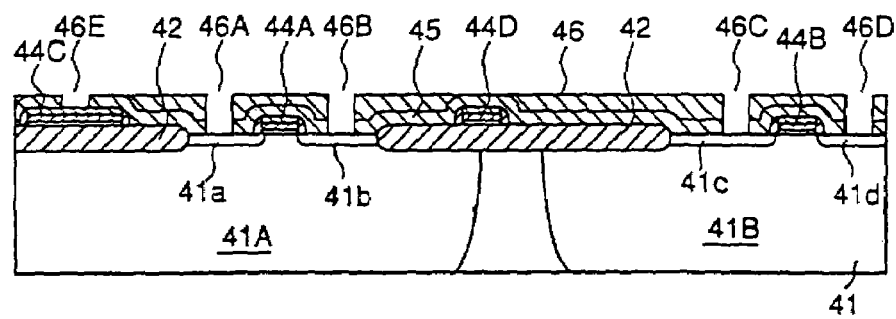
FIG. 13D through 13F are diagrams showing further various steps of fabricating FeRAM according to the fourth embodiment of the present invention.
Figure 13E:
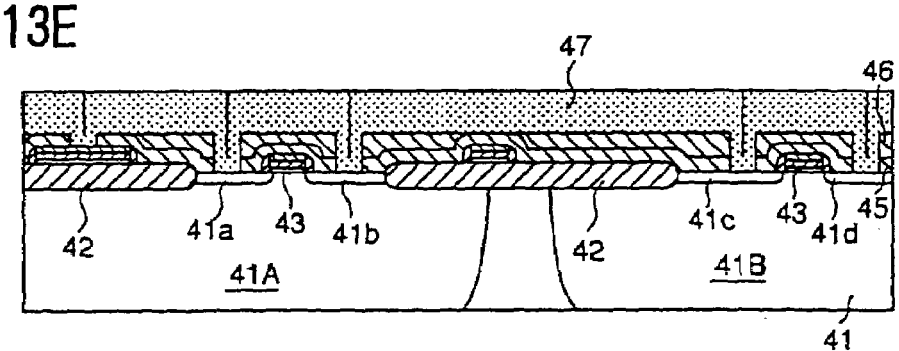

Next, in the step of FIG. 13E, a W layer 47 is deposited on the structure of FIG. 13D so as to fill the contact holes 46A to 46E. Further, in a step shown in FIG. 13F, the W layer 47 thus deposited is subjected to a CMP process with the $SiO_2$ film 46 being used as a stopper. As a result of the polishing process, there are formed W plugs 47A to 47E in correspondence to the contact holes 46A to 46E, respectively.

Figure 13F:
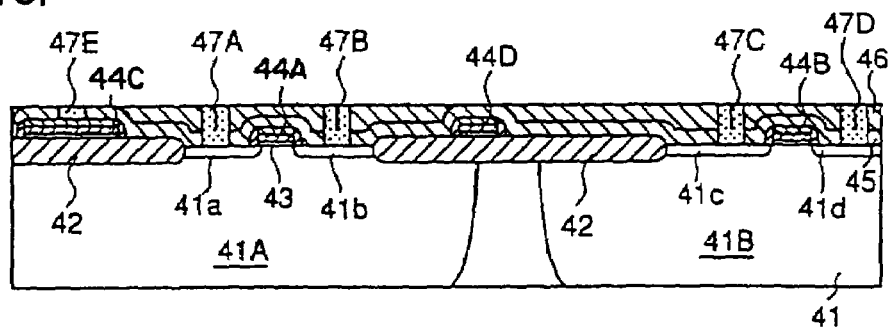
Figure 14G:
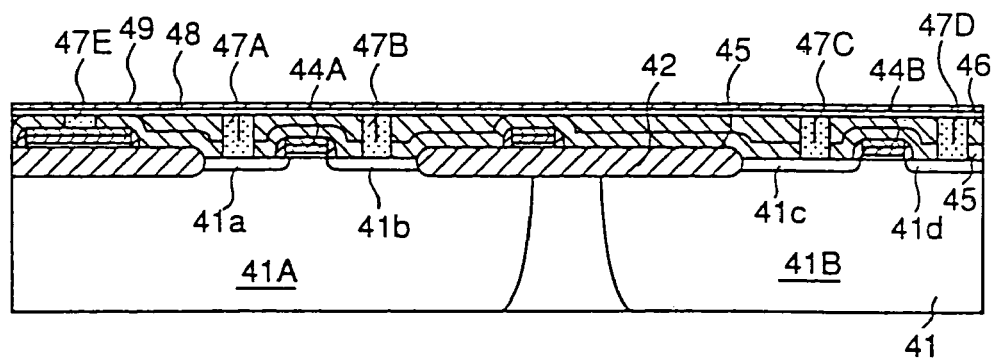
FIG. 14G through 14I are diagrams showing further various steps of fabricating FeRAM according to the fourth embodiment of the present invention.

Next, in the step of FIG. 14G, an oxidization stopper film 48 of SiON and an $SiO_2$ film 49 are deposited consecutively on the structure of FIG. 13F respectively with the thicknesses of 100 nm and 130 nm, respectively, followed by a heating process at 650° C. for 30 minutes conducted in an $N_2$ atmosphere such that a sufficient degassing process is performed.

Figure 14H:
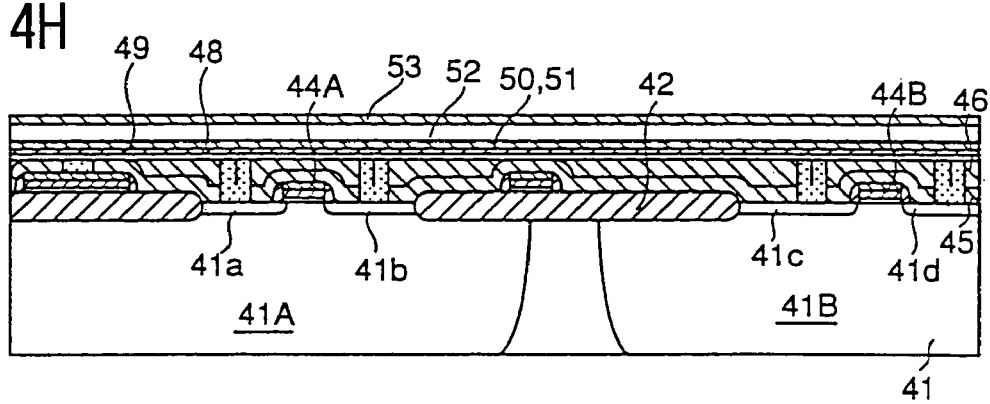

Next, in the step of FIG. 14H, a Ti film 50 and a Pt film 51 are deposited consecutively on the $SiO_2$ film 49 with respective thicknesses of 20 nm and 175 nm by a sputtering process. The Ti film 50 and the Pt film 51 thereon constitute a lower electrode layer. It is preferable that the sputtering process of the Pt film 51 is conducted in an Ar gas with 20% $O_2$ gas being added thereto.

In a step shown in FIG. 14H, after depositing the Pt film 51, the PZT or PLZT film 52 is deposited with a thickness of about 220 nm in the CVD apparatus. In the present embodiment, deposition of the PZT or PLZT film 52 is performed by firstly depositing a PZT or PLZT film belonging to the rhombohedral system with a Ti composition x being less than 0.48 (x<0.48) with a thickness of about 20 nm, then depositing a PZT or PLZT film belonging to the tetragonal system with a Ti composition x being greater than or equal to 0.48 (0.48≦x) with a thickness of about 180 nm and further depositing a PZT or PLZT film belonging to the rhombohedral system with a Ti composition x being less than 0.48 (x<0.48) with a thickness of about 20 nm. Either a sol-gel process or a sputtering process may be performed for deposition of the PZT film or the PLZT film.

Further, in a step shown in FIG. 14H, the substrate 41 is returned to the sputtering apparatus after the above-mentioned rapid thermal processing step. Therein, a Pt film, an $IrO_2$ film or an $SrRuO_3$ film is deposited on the ferroelectric film 52 with a thickness of about 200 nm to form the upper electrode layer 53.

Figure 14I:
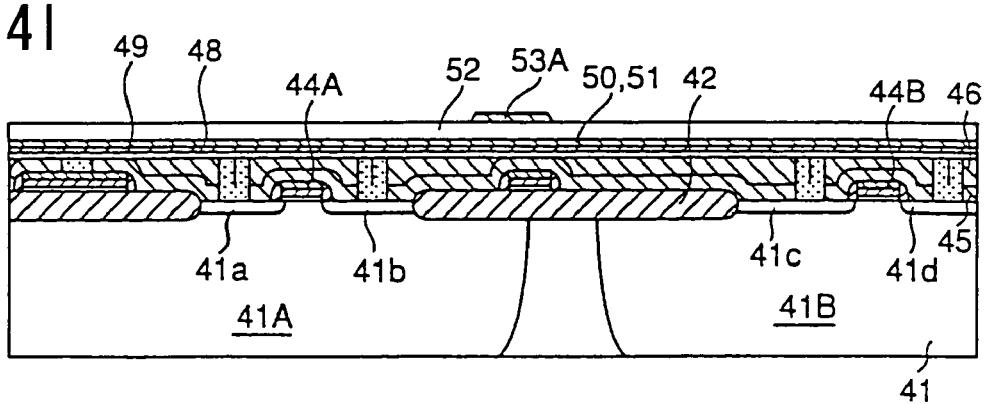

Then, in a step shown in FIG. 14I, a resist pattern is formed on the upper electrode layer 53 and the upper electrode layer 53 is dry-etched using the resist pattern as a mask, such that an upper electrode pattern 53A is formed on the ferroelectric film 52 in correspondence with the upper electrode layer 53. Further, in a step shown in FIG. 14I, after forming the upper electrode pattern 53A, an annealing process is conducted in an $O_2$ atmosphere for 60 minutes at 650° C. so as to remove any damage caused in the ferroelectric film 52 during a sputtering or patterning process of the upper electrode layer 53.

Figure 15J:
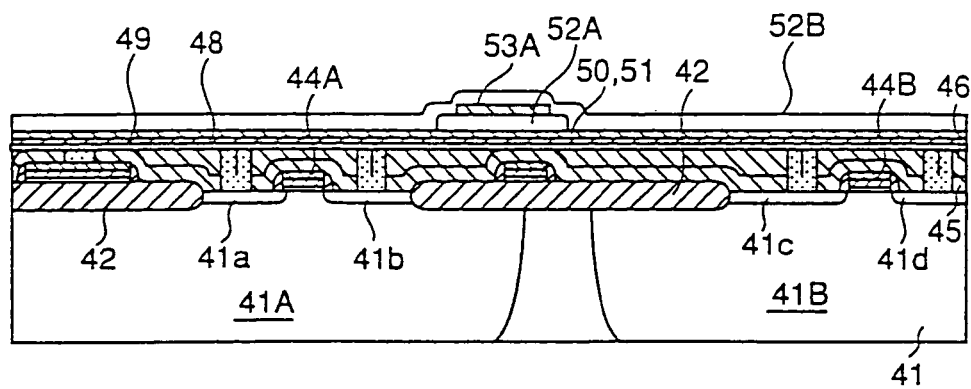
FIG. 15J through 15L are diagrams showing further various steps of fabricating FeRAM according to the fourth embodiment of the present invention.

In a step shown in FIG. 15J, a resist pattern corresponding to a capacitor insulating layer pattern of the desired ferroelectric capacitor is formed on the ferroelectric film 52. Then, the ferroelectric film 52 is dry-etched using the resist pattern as a mask to form a capacitor insulation film pattern 52A. Further, a sputtering process is conducted under the same condition as for the ferroelectric capacitor layer 52 such that an encapping layer 52B of the same material as the ferroelectric capacitor layer 52 is deposited that has a thickness of about 20 nm, and in the $O_2$ atmosphere, a rapid heating process is performed for 60 seconds at 700° C. The encapping layer 52B protects the ferroelectric film 52A from reduction.

Figure 15K:
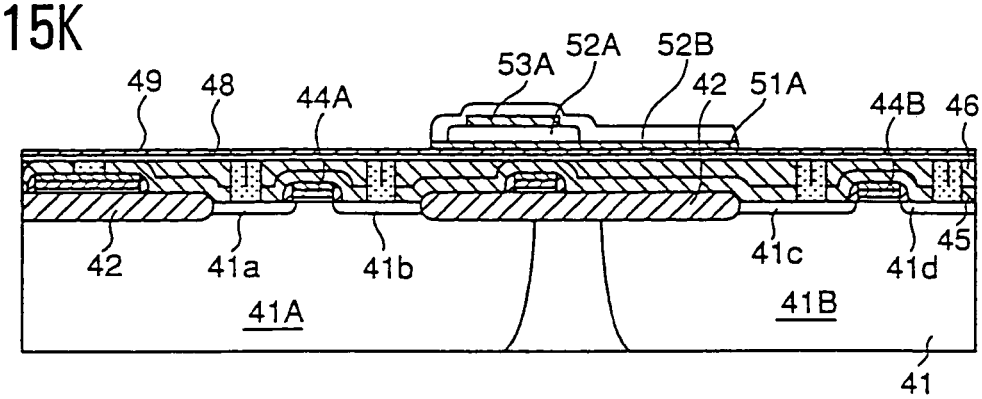

Then, in a step shown in FIG. 15K, a resist pattern corresponding to the desired lower electrode pattern is formed on the lower electrode layer 51, or, the encapping layer 52B, and the encapping layer 52B and underlying lower electrode layers 50, 51 are dry-etched using the resist pattern as a mask to form a lower electrode 51A. Further, in a step shown in FIG. 15K, after patterning the lower electrode 51A, the resist pattern is removed and a heating process is conducted in the $O_2$ atmosphere for 60 minutes at 650° C. so as to remove damage caused in the ferroelectric film 52A during the dry-etching process.

Figure 15L:
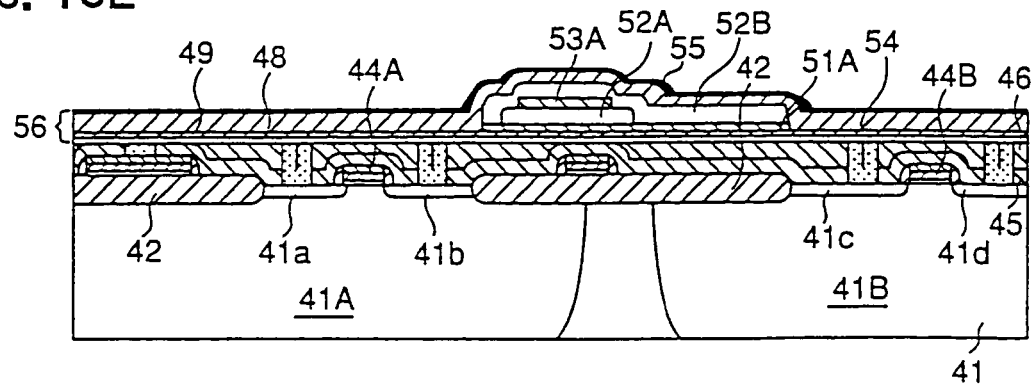

Further, in a process shown in FIG. 15L, an $SiO_2$ film 54 is deposited on the structure shown in FIG. 15K by the CVD process with a thickness of typically about 200 nm. Further, an SOG film 55 is deposited thereon to reduce the level difference at stepped parts. The $SiO_2$ film 54 and the SOG film 55 form an interlayer insulation film 56.

Figure 16M:
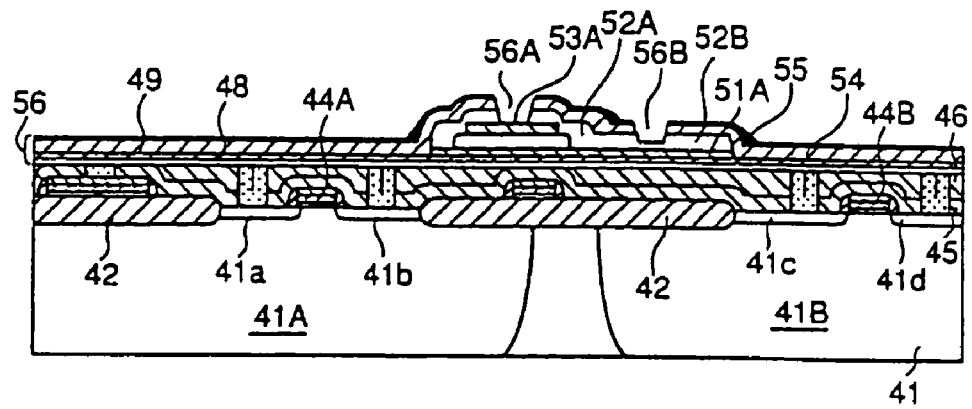
FIG. 16M through 16O are diagrams showing further various steps of fabricating FeRAM according to the fourth embodiment of the present invention.
Figure 16N:
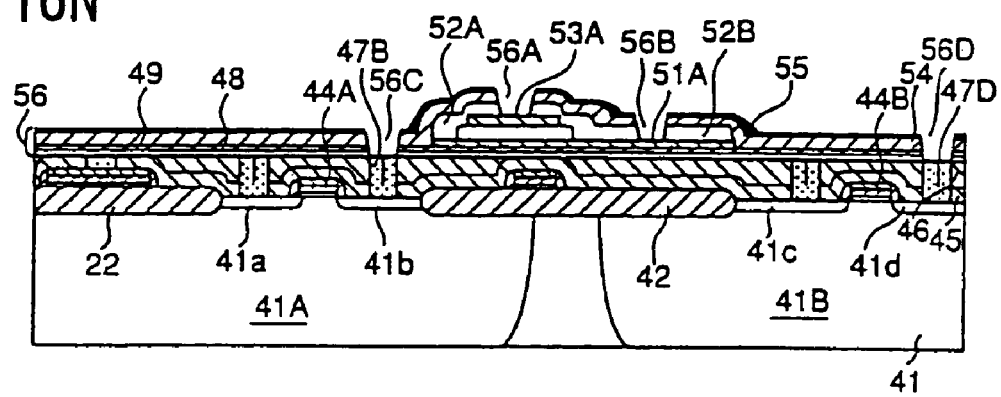

Then, in a step shown in FIG. 16M, a contact hole 56A that exposes the upper electrode pattern 53A and a contact hole 56B that exposes the lower electrode pattern 51A are formed in the interlayer insulation film 56. In a step shown in FIG. 16N, contact holes 56C and 56D that expose the W plugs 47B and 47D, respectively, are formed through the interlayer insulation film 56 and the underlying $SiO_2$ film 49 and SiON anti-oxidation film 48. In a process shown in FIG. 16M, after dry-etching the contact holes 56A and 56B, a heating process is conducted in an $O_2$ atmosphere for 60 minutes at 550° C., so as to remove any damage caused during the dry-etching process.

Figure 16O:
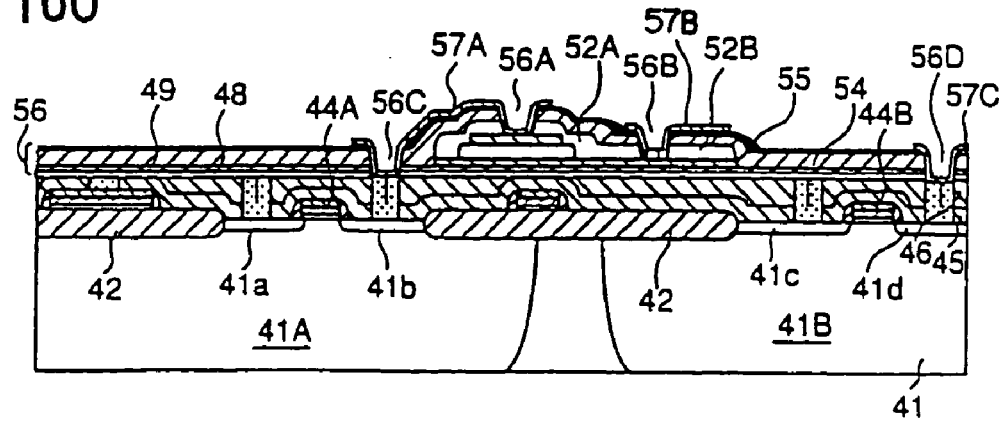

Further, in a step shown in FIG. 16O, a local interconnection pattern 57A that electrically connects the contact hole 56A and the contact hole 56C is formed by a TiN film and similar local interconnection patterns 57B and 57C are also formed on the contact holes 56B and 56D.

Figure 17P:
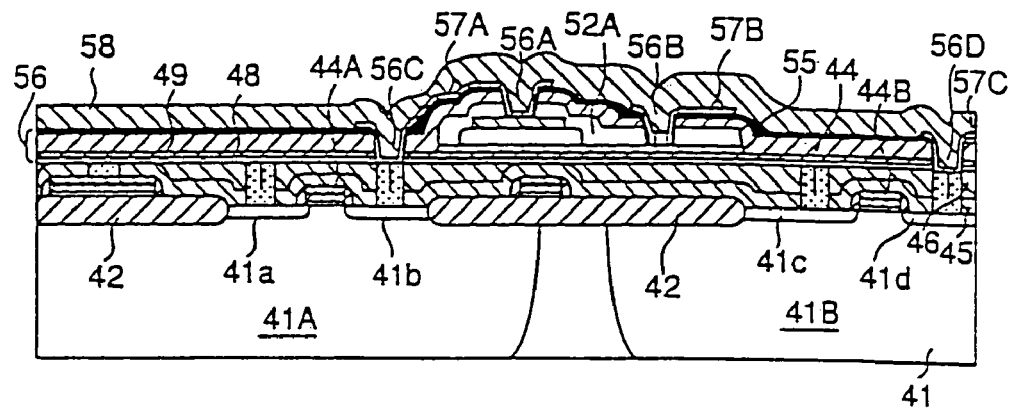
FIG. 17P through 17R are diagrams showing further various steps of fabricating FeRAM according to the fourth embodiment of the present invention.
Figure 17Q:
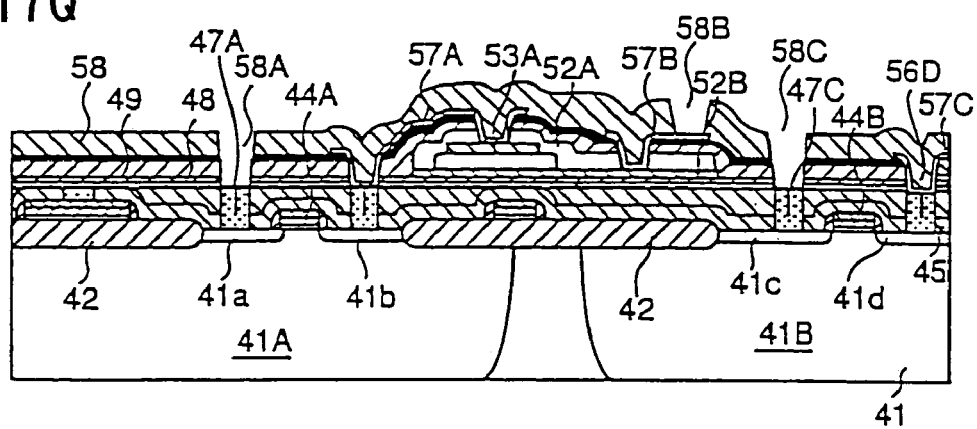

Further, in a process shown in FIG. 17P, an $SiO_2$ film 58 is formed on the structure shown in FIG. 16O. In a step shown in FIG. 17Q, contact holes 58A, 58B and 58C that expose the W plug 47A, the local interconnection pattern 57B and the W plug 47C, respectively, are formed in the $SiO_2$ film 58.

Figure 17R:
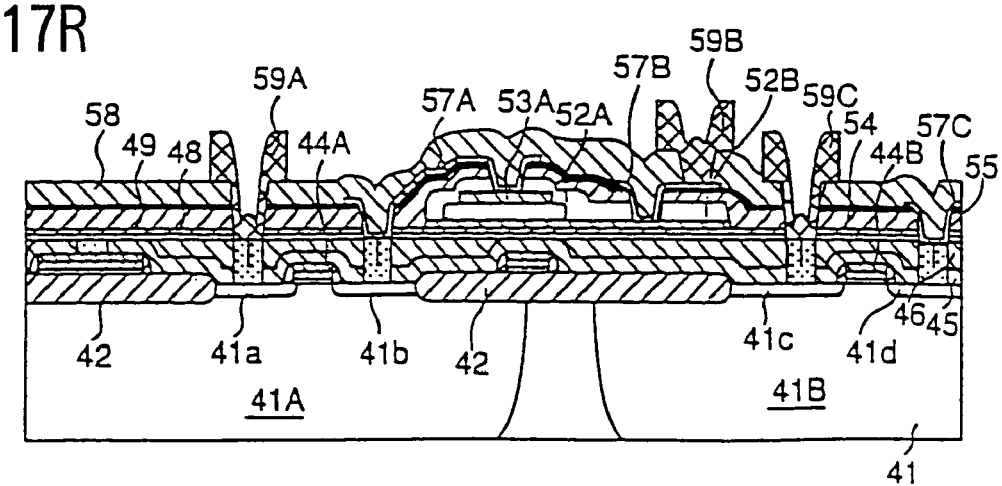

Further, in a process shown in FIG. 17R, electrodes 59A, 59B and 59C are formed in correspondence with the contact holes 58A, 58B and 58C.

In the above-described steps, the steps of forming an interlayer insulation film and a local interconnection pattern may be repeated to form a multi-level metallization structure.

Further, the present invention is not limited to these embodiments, and variations and modifications may be made without departing from the scope of the present invention.

The present application is based on Japanese priority application No.2001-334576 filed on Nov. 1, 2001, the entire contents of which are hereby incorporated by reference.

What is claimed is:

1. A ferroelectric memory device, comprising:

a transistor formed on a semiconductor substrate; and a ferroelectric capacitor connected electrically to said transistor, said transistor and ferroelectric capacitor both being integrated on the same substrate and constituting said ferroelectric memory device, said ferroelectric capacitor comprising;

a lower electrode;

a ferroelectric film provided over said lower electrode and having a perovskite-type structure; and an upper electrode provided over said ferroelectric film, wherein said ferroelectric film includes a first ferroelectric film part having a first crystal system and formed at an interface between one of said lower electrode and said upper electrode and a second ferroelectric film part, said second ferroelectric film part having a second crystal system that is different from said first crystal system, said first crystal system being a rhombohedral system, said second crystal system being a tetragonal system, and said second ferroelectric film part being oriented in any of the <001> direction and the <111> direction.

2. The ferroelectric memory device as claimed in claim 1, wherein each of said first and second ferroelectric film parts contains Pb, Zr and Ti.

3. The ferroelectric memory device as claimed in claim 1, wherein said first and second ferroelectric film parts have a composition expressed as $Pb(Zr_{1-x}, Ti_x)O_3$, where x represents a composition parameter that is less than 0.48 (x<0.48) for said first ferroelectric film part and greater than or equal to 0.48 (0.48≦x) for said second ferroelectric film part.

4. The ferroelectric memory device as claimed in claim 1, wherein said second ferroelectric film part is oriented in the <001> direction.

5. The ferroelectric memory device as claimed in claim 1, wherein said second ferroelectric film part is oriented in the <111> direction.

6. The ferroelectric memory device as claimed in claim 1, wherein said lower electrode is oriented in the <100> direction.

7. The ferroelectric memory device as claimed in claim 1, wherein said lower electrode is oriented in the <111> direction.

8. The ferroelectric memory device as claimed in claim 7, wherein said second ferroelectric film part has a thickness larger than said first ferroelectric film part.

9. A ferroelectric memory device, comprising:

a transistor formed on a semiconductor substrate; and a ferroelectric capacitor connected electrically to said transistor, said transistor and ferroelectric capacitor both being integrated on the same substrate and constituting said ferroelectric memory device, said ferroelectric capacitor comprising;

a lower electrode;

a ferroelectric film provided over said lower electrode and having a perovskite-type structure; and an upper electrode provided over said ferroelectric film, wherein said ferroelectric film includes a first ferroelectric film part having a first crystal system and formed at an interface between one of said lower electrode and said upper electrode and a second ferroelectric film part, said second ferroelectric film part having a second crystal system that is different from said first crystal system, said first crystal system being an orthorhombic system, said second crystal system being a tetragonal system, and said second ferroelectric film part being oriented in any of the <001> direction and the <111> direction.

10. The ferroelectric memory device as claimed in claim 9, wherein each of said first and second ferroelectric film parts contains Pb, Zr and Ti.

11. The ferroelectric memory device as claimed in claim 9, wherein said first and second ferroelectric film parts have a composition expressed as Pb(Zr1-x, Tix)O3, where x represents a composition parameter that is less than 0.48 (x<0.48) for said first ferroelectric film part and greater than or equal to 0.48 (0.48≦x) for said second ferroelectric film part.

12. The ferroelectric memory device as claimed in claim 9, wherein said second ferroelectric film part is oriented in the <001> direction.

13. The ferroelectric memory device as claimed in claim 9, wherein said second ferroelectric film part is oriented in the <111> direction.

14. The ferroelectric memory device as claimed in claim 9, wherein said lower electrode is oriented in the <100> direction.

15. The ferroelectric memory device as claimed in claim 9, wherein said lower electrode is oriented in the <111> direction.

16. The ferroelectric memory device as claimed in claim 15, wherein said second ferroelectric film part has a thickness larger than said first ferroelectric film part.

* * * * *

UNITED STATES PATENT AND TRADEMARK OFFICE
CERTIFICATE OF CORRECTION

| | |
|---|---|
| PATENT NO. | : 7,423,308 B2 |
| APPLICATION NO. | : 10/967210 |
| DATED | : September 9, 2008 |
| INVENTOR(S) | : Masaki Kurasawa et al. |

It is certified that error appears in the above-identified patent and that said Letters Patent is hereby corrected as shown below:

Column 12, Line 28, change "Pb(Zr1-x, Tix)O3," to --Pb($Zr_{1-x}$, $Ti_x$)$O_3$,--.

Signed and Sealed this

Sixteenth Day of December, 2008

JON W. DUDAS
*Director of the United States Patent and Trademark Office*